US012398277B2

(12) United States Patent
Wu et al.

(10) Patent No.: US 12,398,277 B2
(45) Date of Patent: Aug. 26, 2025

(54) DUAL-MODAL INFORMATION STORAGE AND ANTI-COUNTERFEITING MATERIAL, AND ITS PREPARATION METHOD

(71) Applicant: Hangzhou Normal University, Hangzhou (CN)

(72) Inventors: Baiheng Wu, Hangzhou (CN); Junqiu Liu, Hangzhou (CN); Hui Li, Hangzhou (CN); Xinyang Peng, Hangzhou (CN); Yuqi Wu, Hangzhou (CN)

(73) Assignee: Hangzhou Normal University, Hangzhou (CN)

( * ) Notice: Subject to any disclaimer, the term of this patent is extended or adjusted under 35 U.S.C. 154(b) by 0 days.

(21) Appl. No.: 18/796,263

(22) Filed: Aug. 6, 2024

(65) Prior Publication Data

US 2025/0059385 A1 Feb. 20, 2025

(30) Foreign Application Priority Data

Aug. 14, 2023 (CN) .......................... 202311018725.9

(51) Int. Cl.
| C09D 5/22 | (2006.01) |
| C09D 7/62 | (2018.01) |
| C09D 105/00 | (2006.01) |
| C09D 129/04 | (2006.01) |
| C09D 189/06 | (2006.01) |
| C09K 11/02 | (2006.01) |
| C09K 11/56 | (2006.01) |
| G03F 7/00 | (2006.01) |
| G03F 7/20 | (2006.01) |
| B33Y 10/00 | (2015.01) |

(Continued)

(52) U.S. Cl.
CPC ................ *C09D 5/22* (2013.01); *C09D 7/62* (2018.01); *C09D 105/00* (2013.01); *C09D 129/04* (2013.01); *C09D 189/06* (2013.01); *C09K 11/025* (2013.01); *C09K 11/565* (2013.01); *G03F 7/2002* (2013.01); *G03F 7/70008* (2013.01); *B33Y 10/00* (2014.12); *B82Y 20/00* (2013.01); *B82Y 40/00* (2013.01)

(58) Field of Classification Search
CPC .......... C09D 5/22; C09D 7/62; C09D 105/00; C09D 129/04; C09D 189/06; C09K 11/025; C09K 11/565; G03F 7/2002; G03F 7/70008; B33Y 10/00; B82Y 20/00; B82Y 40/00
See application file for complete search history.

*Primary Examiner* — Robert S Walters, Jr.
(74) *Attorney, Agent, or Firm* — Bayramoglu Law Offices LLC

(57) ABSTRACT

A dual-modal information storage and anti-counterfeiting material, and its preparation method are provided. The dual-modal information storage and anti-counterfeiting material uses cadmium sulfide quantum dots (CdS QDs) as information storage material, and uses the controllable photocorrosion of CdS QDs to achieve dual-modal optical information storage and anti-counterfeiting applications. Firstly, the type of ligands and modification degree of CdS QDs are precisely controlled during the aqueous phase synthesise process, so as to effectively control the photocorrosion phenomenon under UV light irradiation. Subsequently, the CdS QDs are loaded in the hydrogel network, and they are also loaded on the substrates such as cloth and paper by spray coating, dip coating or 3D printing, and the information is stored by digital light patterning. Different from the photochromic function of traditional anti-counterfeiting material, the CdS QDs shows dual-modal patterning characteristics in a wide wavelength range.

5 Claims, 8 Drawing Sheets

(51) Int. Cl.
  *B82Y 20/00*     (2011.01)
  *B82Y 40/00*     (2011.01)

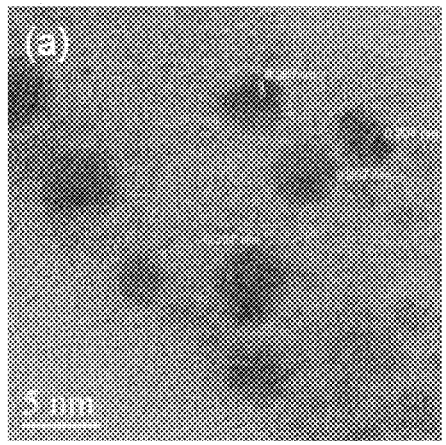
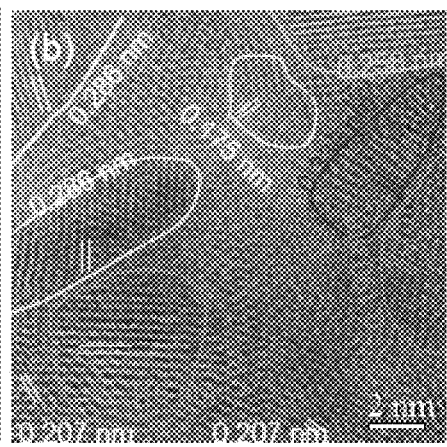
FIG. 1A  FIG. 1B
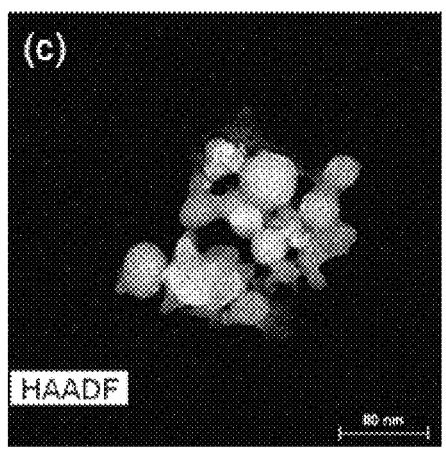
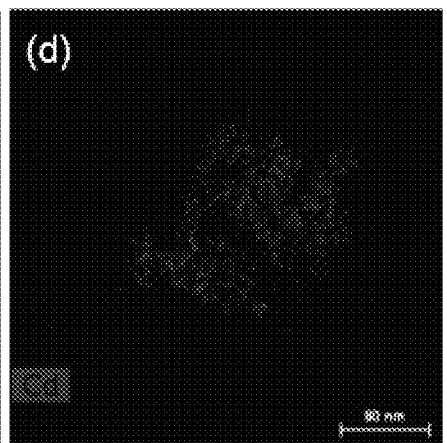
FIG. 1C  FIG. 1D
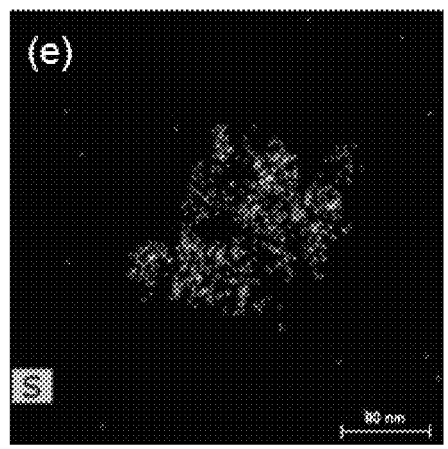
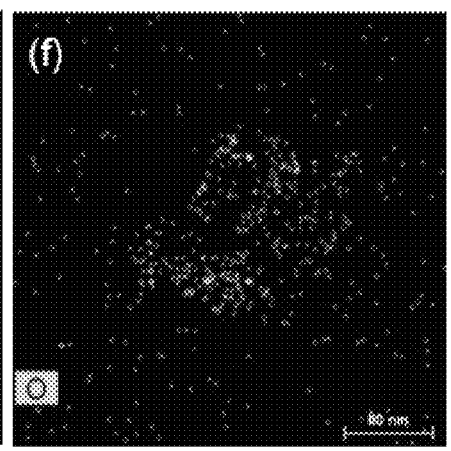
FIG. 1E  FIG. 1F

DUAL-MODAL INFORMATION STORAGE AND ANTI-COUNTERFEITING MATERIAL, AND ITS PREPARATION METHOD

CROSS REFERENCE TO THE RELATED APPLICATIONS

This application is based upon and claims priority to Chinese Patent Application No. 202311018725.9, filed on Aug. 14, 2023, the entire contents of which are incorporated herein by reference.

TECHNICAL FIELD

The invention relates to the field of nanomaterials, in particular to a dual-modal information storage and anti-counterfeiting material, and its preparation method.

BACKGROUND

The explosive and rapid development of information technology is accompanied by the proliferation of false information, which has serious consequences in economic field, and it also brings great troubles to people's daily lives. The development of information storage media with anti-counterfeiting function has become an important research topic. Among them, luminescent materials are considered to be the most competitive candidate materials for information encryption and anti-counterfeiting application, such as cadmium sulfide quantum dots (CdS QDs), carbon dots, small molecule dyes, metal cluster and metal-organic framework material, which have been widely used. The information compiled based on the aforementioned materials is imperceptible under visible light and can only be discerned through specific stimulation and development, thereby possessing a certain level of anti-counterfeiting security. However, with the progress of material technology, the forgery difficulty of single-modal photochromic luminescent material is gradually reduced, and high value-added product also puts forward higher requirements for the safety of anti-counterfeiting material. Therefore, the development of multi-modal anti-counterfeiting material has received more and more attention.

The CdS QDs are a kind of commonly used material in the field of CdS QDs, known for its simple synthesis method and low cost, making it widely applicable. The photocorrosion of CdS QDs will cause a decrease in fluorescence yield, which is usually avoided as a negative factor in the material preparation process. However, the occurrence of photocorrosion is accompanied by alterations in the material's color. These changes can be reversed in the presence of oxygen but lead to irreversible aggregation-induced fluorescence quenching of certain CdS QDs. These unique optical characteristics inspired the invention of preparing dual-modal information storage and anti-counterfeiting material by effectively controlling the photocorrosion of CdS QDs. The aforementioned material exhibits not only an instantaneous photochromic response to ultraviolet (UV) light irradiation, but also the ability to retain a historical pattern of partial fluorescence quenching caused by light exposure. Additionally, this method enables programmable patterning changes along with time, thereby enhancing information storage density and anti-counterfeiting safety.

SUMMARY

In view of the shortcomings of the existing technology, the invention describes a dual-modal information storage and anti-counterfeiting material, and its preparation method, which solves the problem of low safety of single-modal anti-counterfeiting material. This method is convenient, efficient, low cost and wide applicability, it can effectively improve the information storage density and anti-counterfeiting security, it has broad application prospects in the fields of information encryption storage and anti-counterfeiting label.

To achieve the above purpose, the invention provides the following solution:

According to the first aspect of the invention, the invention provides a preparation method for dual-modal information storage and anti-counterfeiting materials, which comprises the following steps:

(1) Synthesizing CdS QDs modified by thiol ligand with controllable photocorrosion function in an aqueous phase.

(2) Preparing the hydrogel ink containing the CdS QDs synthesized in Step (1) and applying it onto a substrate through spray coating, dip coating, or 3D printing to obtain the dual-modal information storage and anti-counterfeiting materials.

As a preferred scheme of the invention, in Step (1), the thiol ligands are thioglycolic acid, thiol ethylamine, mercaptoethanol, methyl thioglycolate, L-cysteine or glutathione ligand; a molar ratio of cadmium chloride to thiol ligand is between 1:1-1:2. By precisely controlling an amount of addition of thiol ligand, the modification of thiol ligand is not sufficient, so as to effectively prepare CdS QDs with controllable photocorrosion function. This in turn facilitates the application of dual-modal information storage and anti-counterfeiting.

As the preferred scheme of the invention, the Step (1) comprise following steps: preparing a $CdCl_2$ aqueous solution, continuously stirring and adding thiol ligand to produce precipitate; adding HCl or NaOH solution dropwise until the pH of the solution reaches 7; adding $Na_2S$ aqueous solution under stirring. Finally, adding ethanol for precipitating, then obtaining CdS QDs by centrifugation and washing.

As the preferred scheme of the invention, the concentration of $CdCl_2$ aqueous solution is 0.001 mol/L-0.01 mol/L, the concentration of $Na_2S$ aqueous solution is 0.001 mol/L-0.01 mol/L, and the molar ratio of $CdCl_2$ to $Na_2S$ is 1:2-2:1.

As the preferred scheme of the invention, in Step (2), when using methods of spray coating and dip coating, the substrate is a cloth or paper, the hydrogel ink is composed of 2 wt %-10 wt % polyvinyl alcohol (PVA) aqueous solution, and a content of CdS QDs in the hydrogel ink is 0.01 wt %-0.5 wt %.

As the preferred scheme of the invention, in the Step (2), when using 3D printing method, there is no requirement for the material of the substrate; the hydrogel ink is composed of 0.5 wt %-5 wt % agarose aqueous solution or 10 wt %-30 wt % gelatin aqueous solution, the content of CdS QDs in hydrogel ink is 0.01 wt %-0.5 wt %.

According to a second aspect of the invention, the invention provides a dual-modal information storage and anti-counterfeiting material prepared by the above method.

According to a third aspect of the invention, the invention provides an information encryption storage and anti-counterfeiting method based on the dual-modal information storage and anti-counterfeiting materials, that is, the application of the dual-modal information storage and anti-counterfeiting materials in information encryption storage and anti-counterfeiting applications. It comprises: adopting a digital light processing (DLP) UV projector or photomask-UV lithography technique, using a 300-500 nm light source to irradiate patterned information on the dual-modal information storage and anti-counterfeiting materials, and the brown-black photocorrosion discoloration occurs in the irradiation area, so as to realize the storage of patterned information; then, the light source is turned off, and a discoloration area is gradually restored under aerobic environment until it is invisible under visible light, so as to realize the information encryption storage.

Conducting irradiation on the sample by using a UV light with a power of less than 0.5 W, partial fluorescence quenching occurs in the patterned area and presents stored patterned information, thereby achieving an anti-counterfeiting verification.

When the light source irradiates the patterned information onto the dual-modal information storage and anti-counterfeiting materials, an irradiation power of the light source is 0.5-5 W, and a light projector or photomask accuracy is greater than 50 μm; when utilizing a photomask-UV lithography technique, the patterned information precisely corresponds to the photomask structures.

The CdS QDs prepared by the method described in the invention have controllable photocorrosion characteristics, and it can realize dual-modal information storage and anti-counterfeiting applications that can not only make an instantaneous photochromic response to UV light irradiation, but also retain permanent patterns of light irradiation relevant to its historical exposure to UV light through partial fluorescence quenching. Such unique optical characteritics solves a problem of low safety of single-modal anti-counterfeiting material. This method is convenient, efficient, low cost and wide applicability, it can effectively improve information storage density and anti-counterfeiting security and it has broad application prospect in the field of information encryption storage and anti-counterfeiting label.

BRIEF DESCRIPTION OF THE DRAWINGS

FIGS. 1A-1F show the transmission electron microscope characterization data of CdS QDs; among them, FIG. 1A is the transmission electron microscope image of CdS QDs; FIG. 1B is the transmission electron microscopy image of lattice fringes of CdS QDs after UV light irradiation; FIG. 1C is the scanning transmission electron microscope image of high-angle annular dark field of cadmium sulfide CdS QDs after UV light irradiation; FIG. 1D, FIG. 1E and FIG. 1F are the distribution images of cadmium, sulfur and oxygen elements of cadmium sulfide CdS QDs after UV light irradiation respectively.

FIG. 2A is the UV absorption spectrum of CdS QDs; FIG. 2B is the fluorescence emission spectra of CdS QDs before and after UV light irradiation;

FIG. 3A is the visible light transmission spectrum of CdS QDs after UV light irradiation for different time; FIG. 3B is the visible light transmission spectrum of CdS QDs after UV light irradiation and after recovery in aerobic environment for different time; FIG. 3C shows the change of the transmittance of the CdS QDs at 650 nm after several cycles of UV light irradiation-oxygen treatment;

FIG. 4A is the schematic diagram of the digital light patterning process of CdS QDs material; FIG. 4B is the image of dual-modal information storage and anti-counterfeiting applications of the agarose hydrogel material containing CdS QDs prepared according to Embodiment 1; and FIG. 4C is the photochromic photo of the CdS QDs coated paper substrates prepared according to Embodiment 2.

DETAILED DESCRIPTION OF THE EMBODIMENTS

The following embodiments are used to illustrate the invention, but the invention is not limited to the embodiments as follows.

Embodiment 1: dual-modal information storage and anti-counterfeiting applications of agarose hydrogel material containing CdS QDs.

(1) The agarose hydrogel material containing CdS QDs is prepared by the method of the invention, the specific steps are as follows:

10 mL of 0.005 mol/L $CdCl_2$ aqueous solution is prepared and continuously stirred, at the same time, thioglycolic acid ligand is added according to the molar ratio of 1:2 to produce milky white precipitate; 1M HCl or NaOH solution is added dropwise until the pH of the above solution reaches 7, and the solution became colorless; 2 mL of 0.005 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 0.5 wt % 60° C. agarose aqueous solution, and the quantum dot concentration is 0.01 wt %, the agarose hydrogel containing CdS QDs is obtained by cooling.

Figure 2A:
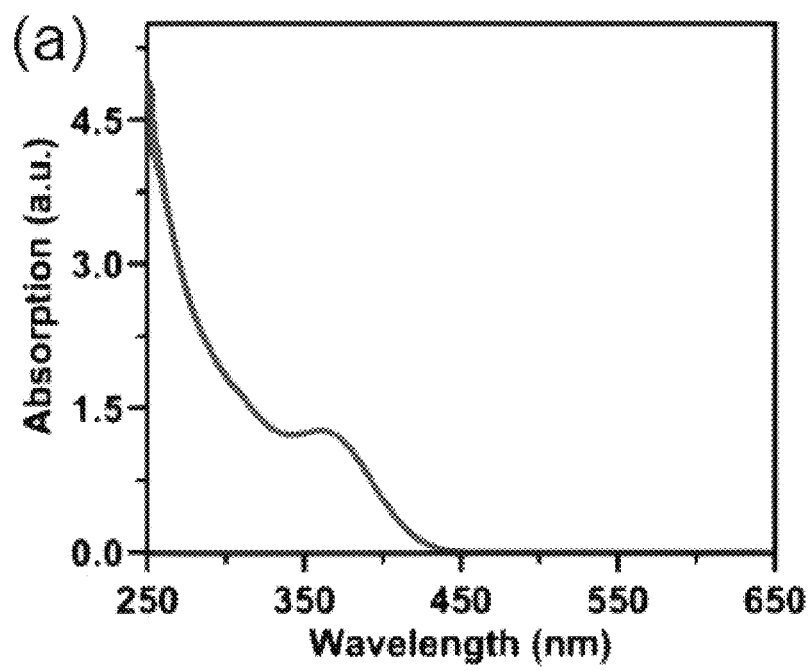
FIGS. 2A-2B show the spectral data of CdS QDs; among them.
Figure 2B:
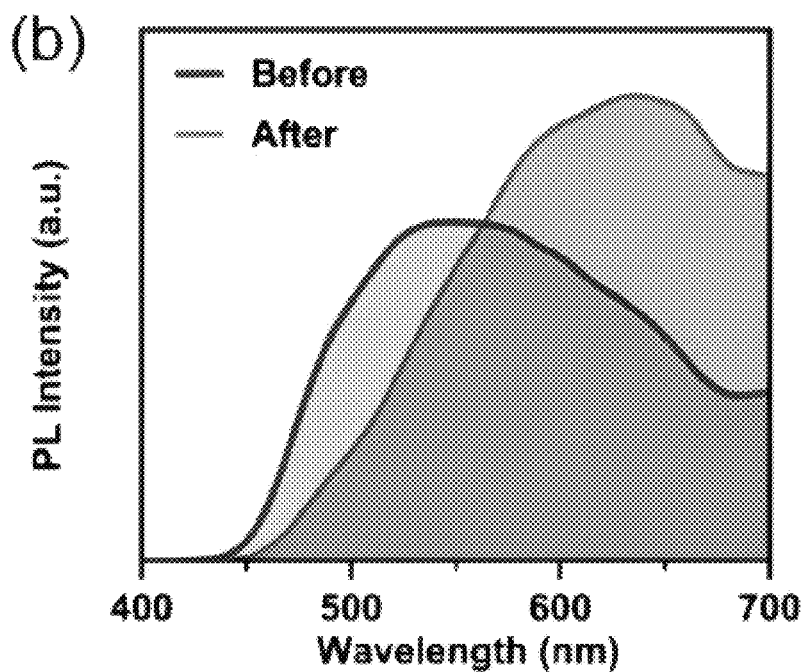
Figure 3A:
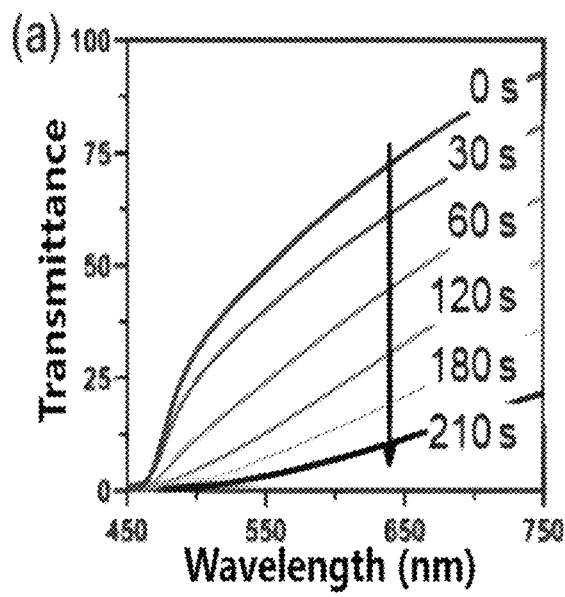
FIGS. 3A-3C show the spectral data of the photochromism of CdS QDs; among them.
Figure 3B:
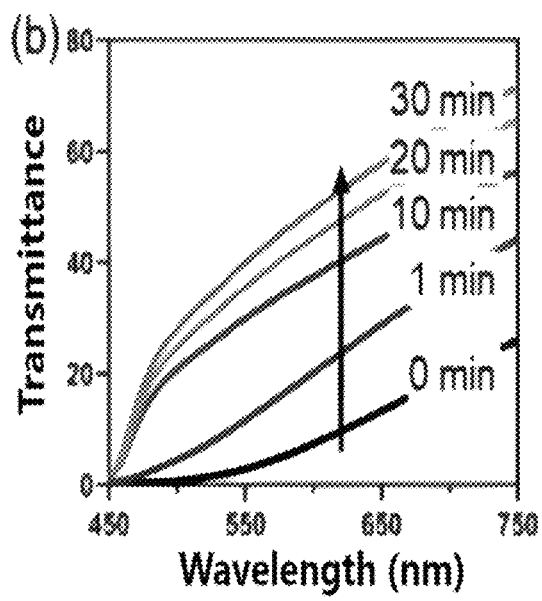
Figure 3C:
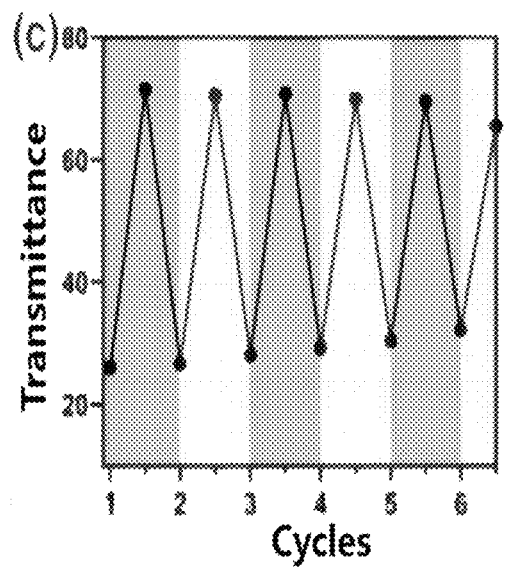
Figure 4A:
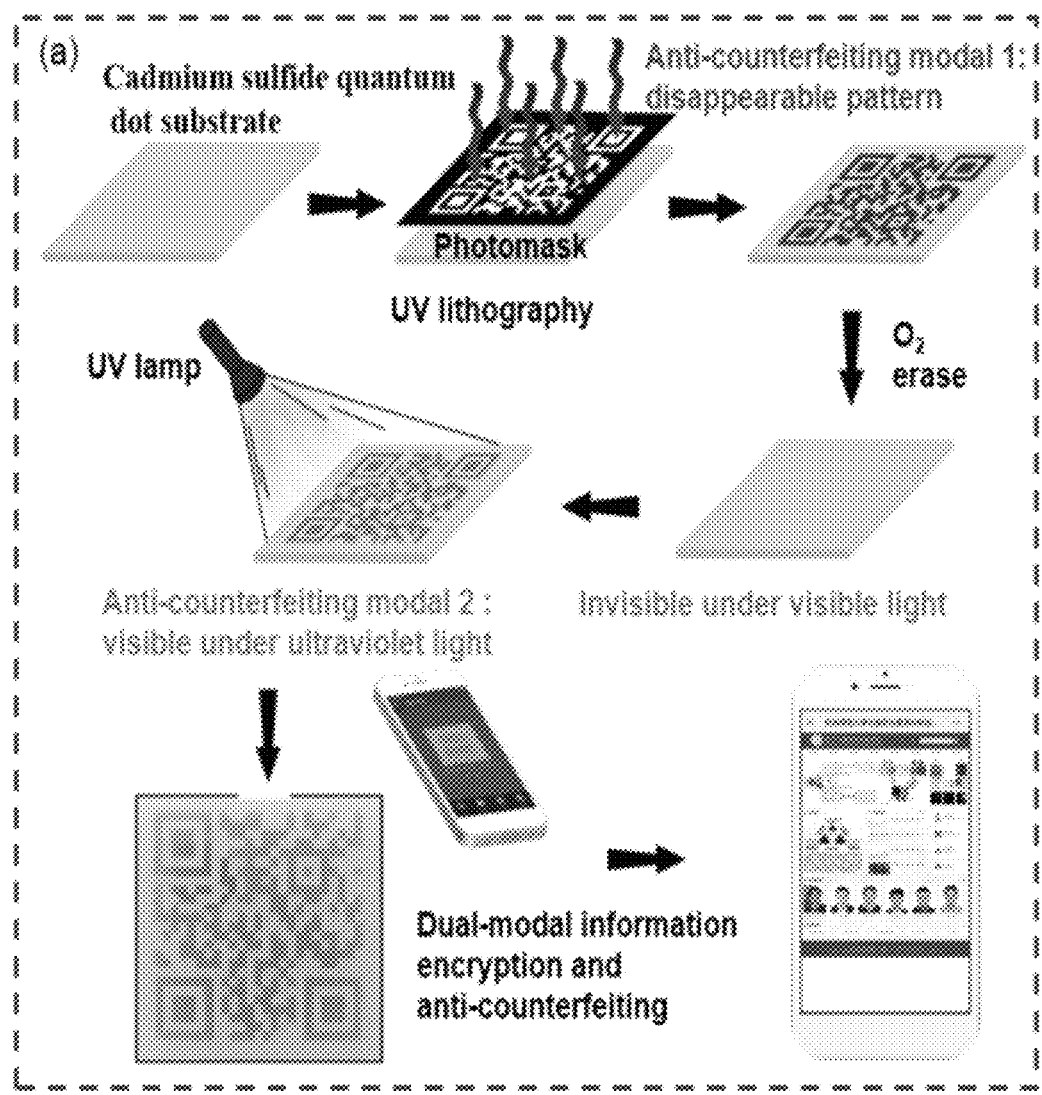
FIGS. 4A-4C are the schematic diagrams and the physical display diagrams of the dual-modal information storage and anti-counterfeiting applications of CdS QDs. Among them.
Figure 4B:
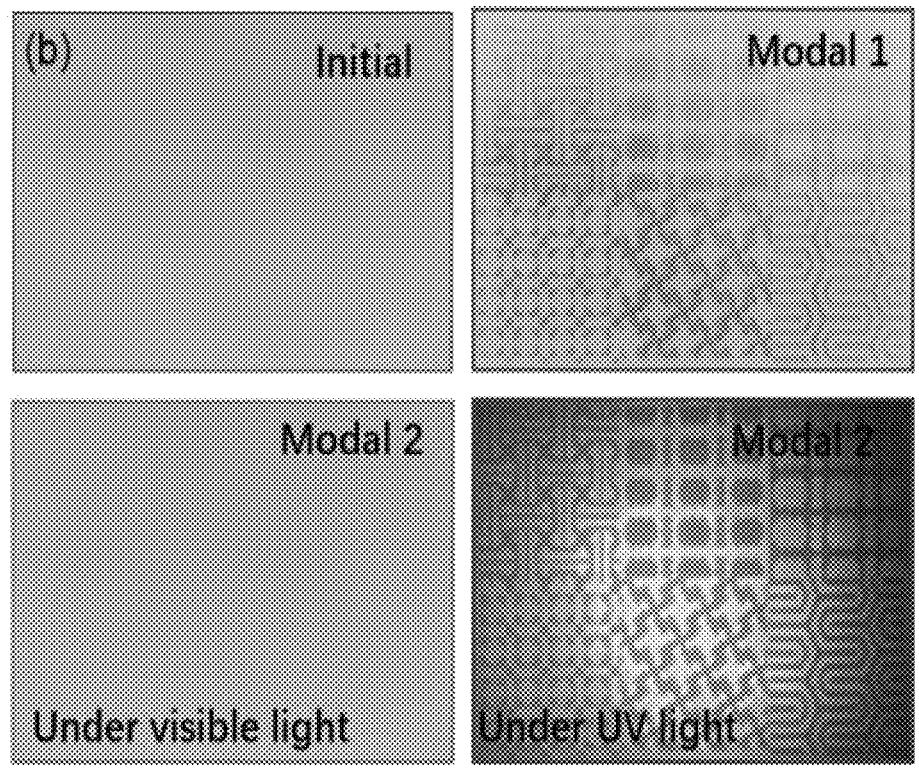

(2) The method of the invention is used to realize the dual-modal information storage and anti-counterfeiting applications, the specific steps are as follows:

The sample is irradiated by a UV light source with a 5 W power and a wavelength of 365 nm through a patterned photomask, the brown-black photocorrosion discoloration occurs immediately in the irradiated area, and the UV light source is turned off, after the reaction with oxygen under aerobic environment, the discoloration area gradually recovers until no difference is seen under visible light; when the sample is irradiated by 0.3 W UV light, the patterned area shows the pattern same as the photomask due to partial fluorescence quenching, as shown in FIG. 4B. Finally, dual-modal information storage and anti-counterfeiting applications are realized.

Embodiment 2: photochromic information storage and anti-counterfeiting applications of CdS QDs coated paper substrates.

(1) The CdS QDs coated paper substrates are prepared by the method of the invention, the specific steps are as follows:

50 mL of 0.001 mol/L $CdCl_2$ aqueous solution is prepared and continuously stirred, at the same time, thiol ethylamine ligand is added according to the molar ratio of 1:1 to produce milky white precipitate; 1M HCl or NaOH solution is added dropwise until the pH of the above solution reaches 7, and the solution became colorless; 5 mL of 0.001 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 10 wt % PVA aqueous solution, and the quantum dot concentration is 0.1 wt %, the uniform load is achieved by spraying coating the solution onto the paper substrates.

Figure 4C:
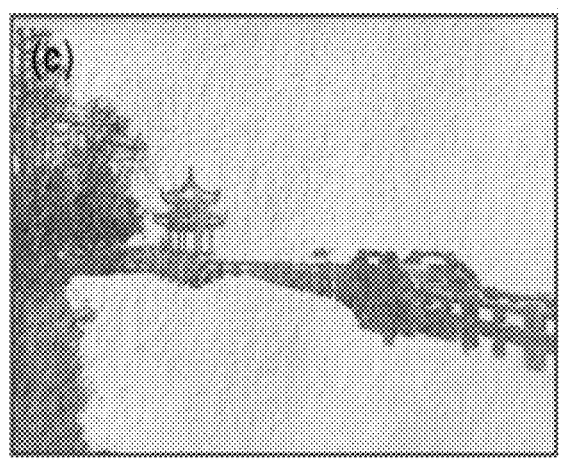

(2) The method of the invention is used to realize the photochromic information storage and anti-counterfeiting applications, the specific steps are as follows:

The sample is irradiated by a UV light source with a 3 W power and a wavelength of 300 nm through a patterned photomask, the brown-black photocorrosion discoloration occurs immediately in the irradiated area, and the UV light source is turned off, after the reaction with oxygen under aerobic environment, the discoloration area gradually recovers until no difference is seen under visible light; as shown in FIG. 4C, photochromic information storage and anti-counterfeiting applications are realized.

Embodiment 3: photochromic information storage and anti-counterfeiting applications of CdS QDs coated cloth substrates.

(1) The CdS QDs coated cloth substrates are prepared by the method of the invention, the specific steps are as follows:

10 mL of 0.01 mol/L $CdCl_2$ aqueous solution is prepared and continuously stirred, at the same time, mercaptoethanol ligand is added according to the molar ratio of 1:4 to produce milky white precipitate; 1M HCl or NaOH solution is added dropwise until the pH of the above solution reaches 7, and the solution became colorless; 0.5 mL of 0.01 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 2 wt % PVA aqueous solution, and the quantum dot concentration is 0.1 wt %, the uniform load is achieved by spraying coating the solution onto the cloth substrates.

(2) The method of the invention is used to realize the photochromic information storage and anti-counterfeiting applications, the specific steps are as follows:

The sample is irradiated by a UV light source with a 2 W power and a wavelength of 365 nm through a patterned photomask, the brown-black photocorrosion discoloration occurs immediately in the irradiated area, and the UV light source is turned off, after the reaction with oxygen under aerobic environment, the discoloration area gradually recovers until no difference is seen under visible light.

Embodiment 4: dual-modal information superposition encryption of agarose hydrogel material containing CdS QDs.

(1) The agarose hydrogel material containing CdS QDs is prepared by the method of the invention, the specific steps are as follows:

25 mL of 0.008 mol/L $CdCl_2$ aqueous solution is prepared and continuously stirred, at the same time, methyl thioglycolate ligand is added according to the molar ratio of 1:1 to produce milky white precipitate; the 1M HCl or NaOH solution is added dropwise until the pH of the above solution reaches 7, and the solution became colorless; 3 mL of 0.008 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 1 wt % 60° C. agarose aqueous solution, and the quantum dot concentration is 0.1 wt %, then the agarose hydrogel material containing CdS QDs is obtained by cooling.

Figure 5:
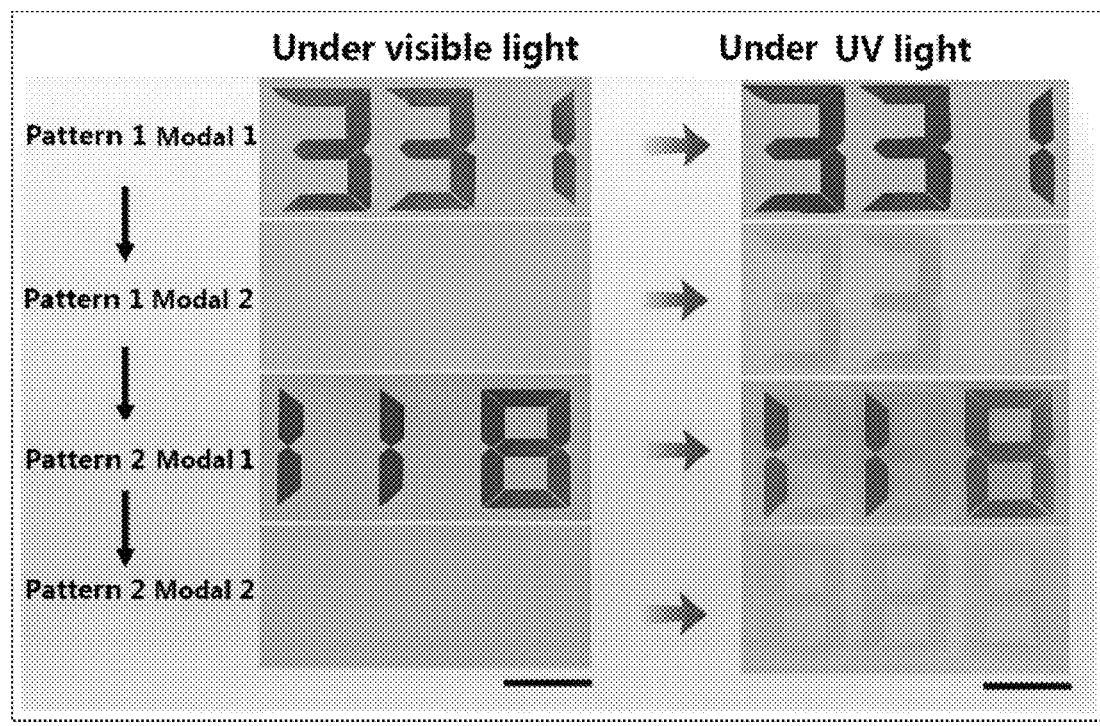
FIG. 5 is the image of dual-modal information storage and anti-counterfeiting applications of the agarose hydrogel material containing CdS QDs prepared according to Embodiment 4.

(2) The method of the invention is used to realize the superposition encryption of dual-modal information, the specific steps are as follows:

As shown in FIG. 5, the sample is irradiated by a 365 nm UV light source with a DLP UV projector of 1 W power, the initial irradiation pattern is the matchstick number '331', and the brown-black photocorrosion discoloration pattern '331' occurs immediately in the irradiation area, the UV light source is turned off, and after the reaction with oxygen under aerobic environment, the discoloration area is gradually restored until no difference is seen under visible light; the sample is irradiated by a UV light with a low power of 0.1 W, and the partial fluorescence quenching occurs in the patterned area, which shows an irradiation pattern of '331'. The matchstick number '118' pattern is irradiated again under the same condition, the brown-black photocorrosion discoloration pattern '118' occurs in the irradiation area immediately, then the UV light source is turned off, after the reaction with oxygen under aerobic environment, the discoloration area gradually recovers until there is no difference in visible light, when the sample is exposed to a UV light with a low power of 0.1 w, the partial fluorescence quenching occurs in the patterned area, which shows a superimposed pattern '888' from two times of UV irradiation, as shown in FIG. 5. Thus, the superposition encryption of dual-modal information is realized.

Embodiment 5: dual-modal information accumulation and anti-counterfeiting applications of agarose hydrogel material containing CdS QDs.

(1) The agarose hydrogel material containing CdS QDs is prepared by the method of the invention, the specific steps are as follows:

20 mL of 0.003 mol/L $CdCl_2$ aqueous solution is prepared and continuously stirred, at the same time, L-cysteine ligand is added according to the molar ratio of 1:4 to produce milky white precipitate; the 1M HCl or NaOH solution is added dropwise until the pH of the above solution reaches 7, and the solution became colorless; 2 mL of 0.003 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 5 wt % 60° C. agarose aqueous solution, and the quantum dot concentration is 0.05 wt %, then the agarose hydrogel material containing CdS QDs is obtained by cooling.

Figure 6:
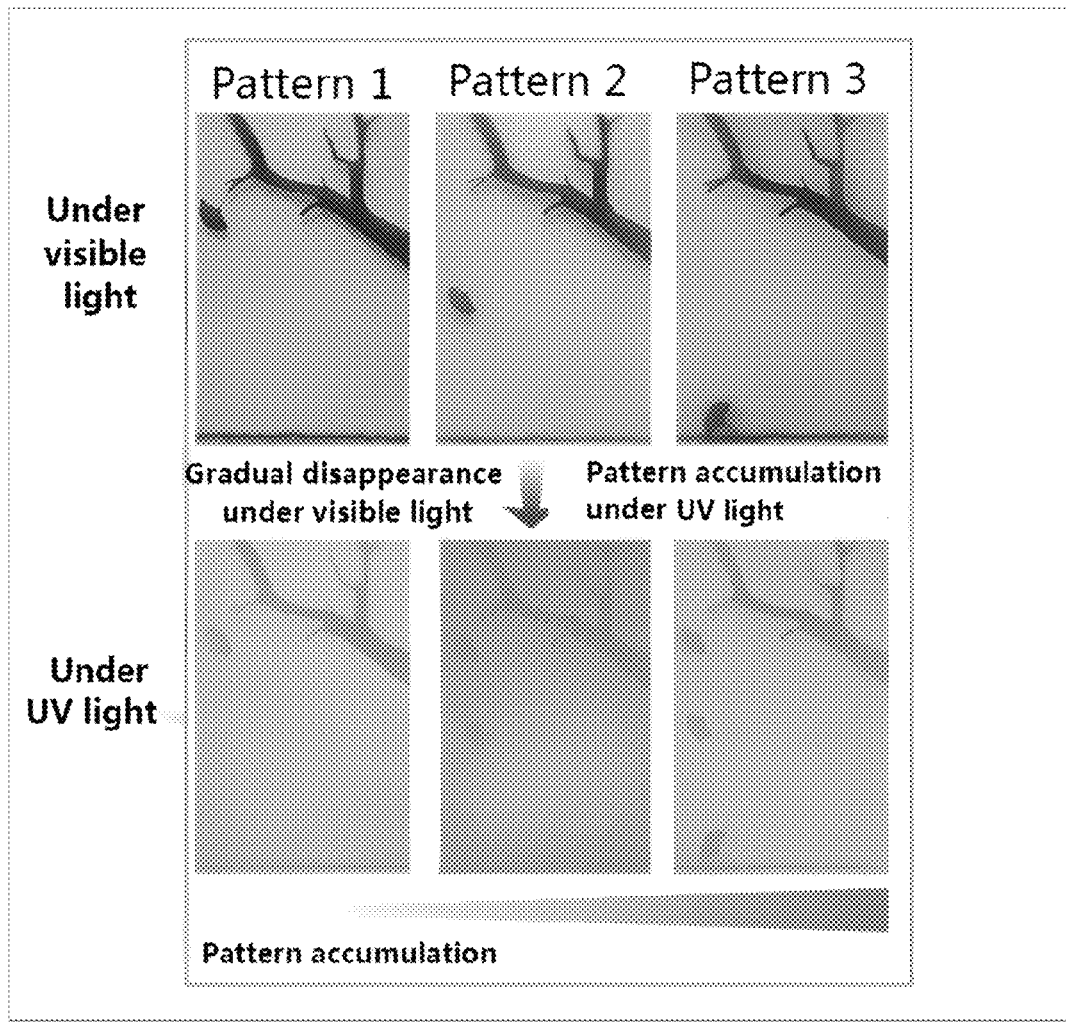
FIG. 6 is the image of dual-modal information storage and anti-counterfeiting applications of the agarose hydrogel material containing CdS QDs prepared according to Embodiment 5.

(2) The method of the invention is used to realize the dual-modal information accumulation and anti-counterfeiting applications, the specific steps are as follows:

As shown in FIG. 6, the sample is irradiated by a UV light source with a 2 W power and a wavelength of 500 nm through a patterned photomask, the brown-black photocorrosion discoloration occurs immediately in the irradiated area, and the UV light source is turned off, after the reaction with oxygen under aerobic environment, the discoloration area gradually recovers until no difference is seen under visible light; when the UV light with 0.4 W power is applied to the sample, partial fluorescence quenching occurs in the patterned area, which presents a patterned photomask. Different photomasks are used to repeatedly irradiate, the immediate photocorrosion photochromic pattern is consistent with the patterned photomask, and the fluorescent pattern presents a superposition of multiple UV irradiations, as shown in FIG. 6. Finally, the dual-modal information accumulation and anti-counterfeiting applications are realized.

Embodiment 6: photochromic information storage and anti-counterfeiting applications of 3D printed gelatin hydrogel material containing CdS QDs.

(1) The 3D printed gelatin hydrogel material containing CdS QDs is prepared by the method of the invention, the specific steps are as follows:

10 mL of 0.005 mol/L $CdCl_2$ aqueous solution is prepared and continuously stirred, at the same time, glutathione ligand is added according to the molar ratio of 1:2 to produce milky white precipitate; the 1M HCl or NaOH solution is added dropwise until the pH of the above solution reaches 7, and the solution became colorless; 2 mL of 0.005 mol/L $Na_2S$ aqueous solution is added under strong stirring, and the color of the solution gradually turns yellow with the increase of stirring time; finally, ethanol is added for precipitating and the CdS QDs are obtained by centrifugal washing. The quantum dot solution is added to a 30 wt % 40° C. gelatin aqueous solution, and the quantum dot concentration is 0.05 wt %, the 'HZNU' pattern is printed on the cold table by a 3D printer, as shown in FIG. 7.

Figure 7:
FIG. 7 is the image of dual-modal information storage and anti-counterfeiting applications of the 3D printed gelatin hydrogel material containing CdS QDs prepared according to Embodiment 6.

(2) The method of the invention is used to realize the photochromic information storage and anti-counterfeiting applications, the specific steps are as follows:

The 'NU' area of the sample is irradiated by a UV light source with a 5 W power and a wavelength of 365 nm through a patterned photomask, the brown-black photocorrosion discoloration occurs immediately in the irradiated area, and the UV light source is turned off, after the reaction with oxygen under aerobic environment, the discoloration area gradually recovers until no difference is seen under visible light; as shown in FIG. 7, photochromic information storage and anti-counterfeiting applications are realized.

Embodiment 7: effect of thiol ligand ratio on photocorrosion discoloration of CdS QDs.

50 mL of 0.005 mol/L $CdCl_2$ aqueous solution is prepared, thioglycolic acid ligand is added according to the molar ratio of 1:0, 1:1, 1:2, 1:4 to produce milky white precipitate; 1M HCl or NaOH solution is added dropwise until the pH of the above solution reaches 7, and the solution became colorless; 2 mL of 0.005 mol/L $Na_2S$ aqueous solution is added under strong stirring, and the color of the solution gradually turns yellow with the increase of stirring time; finally, ethanol is added for precipitating and the CdS QDs are obtained by centrifugal washing.

Figure 8:
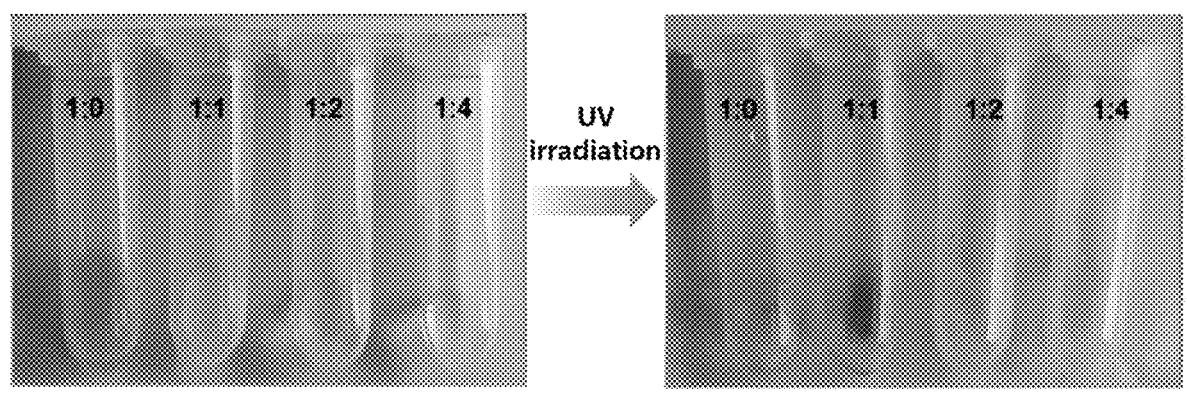
FIG. 8 shows the comparison of physical photo and photochromic property of the CdS QDs synthesized at different thioglycolic acid ligand ratios.

(2) Comparing the photochromic properties of different CdS QDs, the specific steps are as follows:

The CdS QDs are dispersed in aqueous solutions at a concentration of 0.05 wt %. When the molar ratio of cadmium chloride to thioglycolic acid ligand is 1:0, the obtained orange cadmium sulfide precipitate cannot be stably dispersed in water; when the molar ratio of cadmium chloride to thioglycolic acid ligand is 1:1, 1:2, 1:4, the synthesized CdS QDs can be dispersed with water to obtain a stable dispersion at the above concentration. The sample is irradiated by a UV light source with a 5W power and a wavelength of 365 nm for 1 minute, then the photocorrosion discoloration of the sample is compared, when the molar ratio of cadmium chloride to thioglycolic acid ligand of the sample is 1:1 and 1:2, the sample has obvious photocorrosion photochromic phenomenon, and the photocorrosion photochromic phenomenon of synthesized CdS QDs with the ligand ratio of 1:1 is the most significant. As shown in FIG. 8, when the molar ratio of cadmium chloride to thioglycolic acid ligand of CdS QDs is 1:4, the color of the quantum dot solution does not change basically after UV irradiation.

What is claimed is:

1. An information encryption storage and anti-counterfeiting method based on a dual-modal information storage and anti-counterfeiting material prepared by a preparation method, the information encryption storage and anti-counterfeiting method comprising:

by adopting a digital light processing (DLP) ultraviolet (UV) projector or a photomask-UV lithography technique, applying a 300 nm-500 nm light source to irradiate patterned information on the dual-modal information storage and anti-counterfeiting material, wherein an irradiation power of the 300 nm-500 nm light source is 0.5 W-5 W, which realizes a storage of the patterned information by allowing partial fluorescence quenching and causing a brown-black photocorrosion discoloration to occur in an irradiation area;

realizing an encrypted fluorescent patterned information by turning off the 300 nm-500 nm light source and allowing a discoloration area of the irradiation area to be gradually restored under aerobic environment until the discoloration area is invisible under visible light; and achieving an anti-counterfeiting verification by conducting another irradiation on the dual-modal information storage and anti-counterfeiting material with a UV light having a power of less than 0.5W to reveal the encrypted fluorescent patterned information;

wherein the preparation method comprises the following steps:

(1) synthesizing cadmium sulfide quantum dots (CdS QDs) modified by thiol ligand with controllable photocorrosion function in an aqueous phase comprising:

preparing a $CdCl_2$ aqueous solution, continuously stirring the $CdCl_2$ aqueous solution and adding the thiol ligand to produce precipitate;

adding HCl or NaOH solution dropwise until a pH of the $CdCl_2$ aqueous solution including the thiol ligand reaches 7;

adding a $Na_2S$ aqueous solution under stirring;

adding ethanol for precipitating; and obtaining CdS QDs by centrifugation and washing;

wherein a molar ratio of cadmium chloride to the thiol ligand is between 1:1-1:2; and (2) preparing a hydrogel ink containing the CdS QDs synthesized in step (1), and applying the hydrogel ink onto a substrate through spray coating or dip coating to obtain the dual-modal information storage and anti-counterfeiting material.

2. The information encryption storage and anti-counterfeiting method according to claim 1, wherein when the 300 nm-500 nm light source irradiates the patterned information onto the dual-modal information storage and anti-counterfeiting material, a light projector or photomask accuracy is greater than 50 μm; and when the photomask-UV lithography technique is used, the patterned information is a pattern from photomask.

3. The information encryption storage and anti-counterfeiting method according to claim 1, wherein in step (1) of the preparation method for the dual-modal information storage and anti-counterfeiting material, the thiol ligand comprises thioglycolic acid, thiol ethylamine, mercaptoethanol, methyl thioglycolate, L-cysteine or glutathione ligand.

4. The information encryption storage and anti-counterfeiting method according to claim 1, wherein in step (1) of the preparation method for the dual-modal information storage and anti-counterfeiting material, a concentration of the $CdCl_2$ aqueous solution is 0.001 mol/L-0.01 mol/L, a concentration of the $Na_2S$ aqueous solution is 0.001 mol/L-0.01 mol/L, and a molar ratio of $CdCl_2$ to $Na_2S$ is 1:2-2:1.

5. The information encryption storage and anti-counterfeiting method according to claim 1, wherein in step (2) of the preparation method for the dual-modal information storage and anti-counterfeiting material, the substrate is a cloth or a paper, the hydrogel ink is composed of 2 wt %-10 wt % polyvinyl alcohol (PVA) aqueous solution, and a content of CdS QDs in the hydrogel ink is 0.01 wt %-0.5 wt %.

* * * * *